US009559157B2

(12) United States Patent
Ryu et al.

(10) Patent No.: US 9,559,157 B2
(45) Date of Patent: Jan. 31, 2017

(54) DISPLAY DEVICE

(71) Applicant: Samsung Display Co., Ltd., Yongin, Gyeonggi-do (KR)

(72) Inventors: Do-Hyung Ryu, Yongin (KR); Hae-Goo Jung, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 491 days.

(21) Appl. No.: 14/055,532

(22) Filed: Oct. 16, 2013

(65) Prior Publication Data
US 2014/0151654 A1    Jun. 5, 2014

(30) Foreign Application Priority Data
Nov. 5, 2012  (KR) .......................... 10-2012-0124313

(51) Int. Cl.
| H01L 27/32 | (2006.01) |
| H05K 1/02 | (2006.01) |
| H05K 1/11 | (2006.01) |
| H05K 1/14 | (2006.01) |
| H05K 3/36 | (2006.01) |

(52) U.S. Cl.
CPC .......... H01L 27/3297 (2013.01); H05K 1/028 (2013.01); *H01L 27/3276* (2013.01); *H05K 1/118* (2013.01); *H05K 1/147* (2013.01); *H05K 3/361* (2013.01); *H05K 2201/053* (2013.01); *H05K 2201/056* (2013.01); *H05K 2201/10128* (2013.01); *H05K 2201/2009* (2013.01)

(58) Field of Classification Search
CPC .... H05K 1/0278; H05K 1/028; H05K 1/0281; H05K 1/055; H05K 1/056; H05K 3/4691
See application file for complete search history.

(56) References Cited

U.S. PATENT DOCUMENTS

| 5,398,128 | A | 3/1995 | Tajima et al. | |
| 2005/0078459 | A1* | 4/2005 | Yeon | G02F 1/13452 361/749 |
| 2006/0109394 | A1* | 5/2006 | Miyagawa | G02F 1/13452 349/58 |
| 2007/0089900 | A1* | 4/2007 | Mitamura | H05K 1/028 174/254 |
| 2007/0177093 | A1* | 8/2007 | Oohira | H05K 1/028 349/150 |
| 2009/0148678 | A1 | 6/2009 | Hwang | |
| 2011/0235286 | A1* | 9/2011 | Kitayama | G02F 1/13452 361/749 |

FOREIGN PATENT DOCUMENTS

| KR | 10-2004-0046838 | 6/2004 |
| KR | 10-2009-0032220 | 4/2009 |
| KR | 10-2011-0016794 | 2/2011 |

OTHER PUBLICATIONS

Search Report dated Oct. 7, 2015 in the corresponding European Patent Application No. 13191655.3.

* cited by examiner

Primary Examiner — Bryan Junge
(74) Attorney, Agent, or Firm — Knobbe Martens Olson & Bear LLP

(57) ABSTRACT

A display device includes a display panel and a flexible printed circuit (FPC) connected to the display panel. The FPC includes a first region and a second region, the second region having greater flexibility than the first region.

7 Claims, 5 Drawing Sheets

DISPLAY DEVICE

CROSS-REFERENCE TO RELATED APPLICATIONS

This application claims priority to, and the benefit of, Korean Patent Application No. 10-2012-0124313 filed in the Korean Intellectual Property Office on Nov. 5, 2012, the entire contents of which are incorporated herein by reference.

BACKGROUND

Field

The present disclosure relates to a display device. More particularly, the present disclosure relates to a flexible printed circuit (FPC) electrically connected to a display panel.

Description of the Related Technology

In a display device, various integrated circuits are electrically connected to a display panel to drive it. The display panel displays an image.

The integrated circuits can be electrically connected to the display panel through a flexible printed circuit (FPC). The integrated circuits may be mounted on the FPC and connected to the display panel.

For a large display device, an FPC having a size corresponding to the display panel of the large display device is provided. In this case, a combination state of the FPC and the display panel may affect reliability of the display device.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide a display device having a display panel to which an FPC is connected in a stabilized state.

One embodiment provides a display device including a display panel and a flexible printed circuit (FPC) connected to the display panel, wherein the FPC includes at least one first region and at least one second region, the second region having greater flexibility than the first region.

The FPC may be attached to the display panel and fixed thereto.

The FPC may be fixed to the display panel using a bonding pad disposed between the FPC and the display panel.

The FPC may include a plurality of first regions, and the at least one second region may be disposed between the plurality of first regions.

The FPC may include a wiring pattern part and a reinforcing part, the reinforcing part covering a portion of the wiring pattern part, and the second region may correspond to a portion of the wiring pattern part not covered by the reinforcing part.

The FPC may be in a rectangular shape, and a width of the second region in a direction of a short side of the FPC may be smaller than a width of the first region in the direction.

Edges of the second region in a direction of a long side of the FPC may be straight.

Edges of the second region in a direction of the long side of the FPC may be curved.

The edges of the second region may be concave.

The display panel may be formed in a rectangular shape having a pair of long sides and a pair of short sides, and the FPC may be disposed along the long sides of the display panel.

The display panel and the FPC may be formed in a rectangular shape each having a pair of long sides and a pair of short sides, the FPC may be disposed along the long sides of the display panel, and the second region may be bendable in the direction of the long sides of the FPC.

The display panel may be an organic light emitting display panel.

Even if alignment error is generated when the FPC is aligned with a desired position of the display panel, the alignment error can be corrected according to the second region having flexibility greater than that of the first region, and thus the FPC can be fixed to the display panel in a correct alignment state.

Accordingly, the FPC and the display panel can be combined in a stabilized state to improve reliability of the display device.

DETAILED DESCRIPTION OF CERTAIN INVENTIVE EMBODIMENTS

The present invention will be described more fully hereinafter with reference to the accompanying drawings, in which certain embodiments of the invention are shown. As those skilled in the art would realize, the described embodiments may be modified in different ways, without departing from the spirit or scope of the present invention.

In the whole specification, unless explicitly described to the contrary, the word "comprise" and variations such as "comprises" or "comprising", will be understood to imply the inclusion of stated elements but not the exclusion of any other elements.

In the following description of the embodiments, it will be understood that, when an element such as a layer (film), region, pattern, or structure is referred to as being "on" or "under" another element, it can be "directly" on or under another element or can be "indirectly" formed such that an intervening element is also present. Also, terms such as "on" or "under" should be understood on the basis of the drawings. Furthermore, the expression "on" or "under" may be used herein to represent the relationship of one element to another element as illustrated in the figures. It will be understood that this expression is intended to encompass different orientations of the elements in addition to the orientation depicted in the figures, namely, to encompass both "on" and "under".

Figure 1:
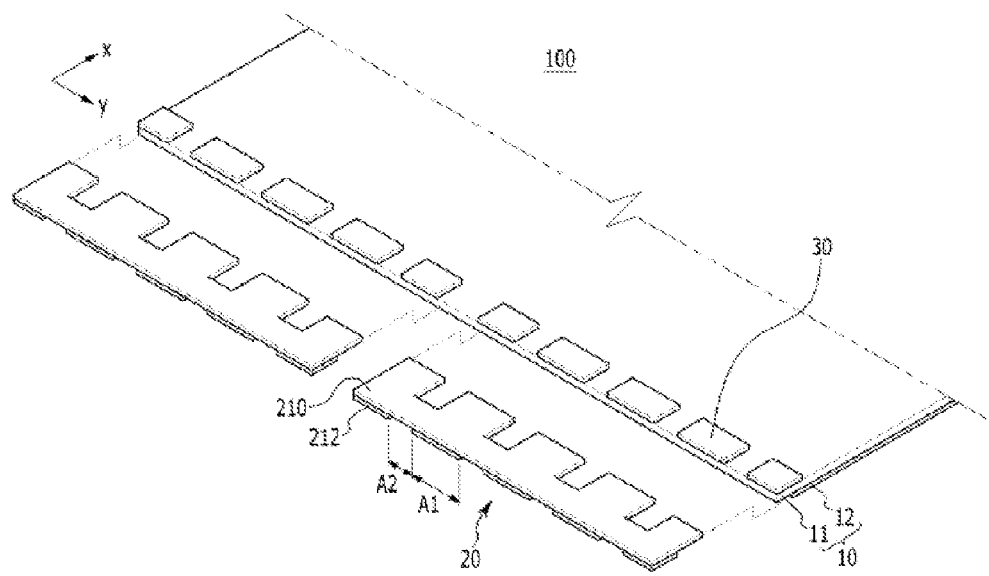
FIG. 1 is a partial exploded perspective view of a display device according to a first embodiment.
Figure 2:
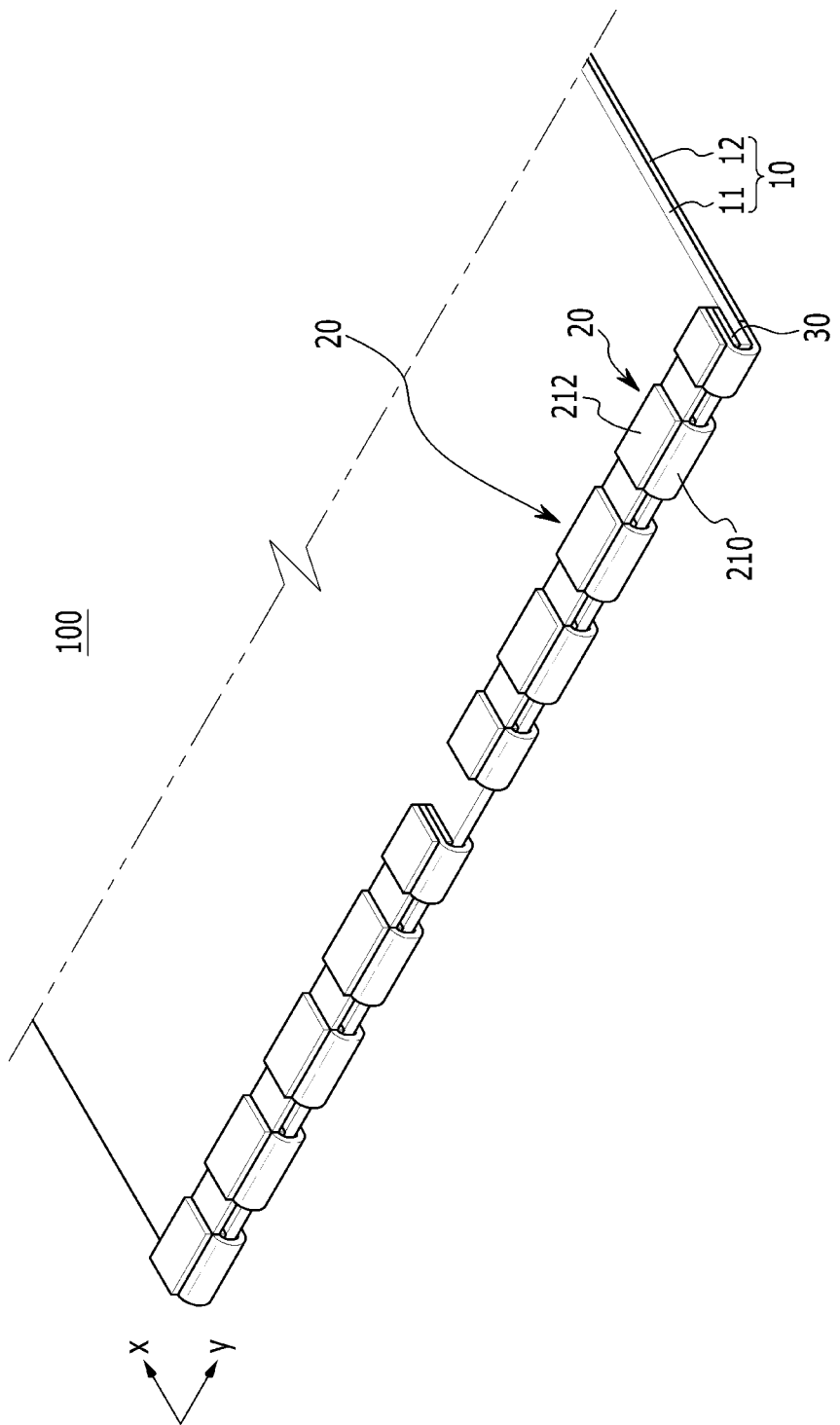
FIG. 2 is a perspective view of the display device shown in FIG. 1.

FIG. 1 is a partial exploded perspective view of a display device according to a first embodiment and FIG. 2 is a perspective view of the display device shown in FIG. 1.

Referring to FIGS. 1 and 2, a display device 100 includes a display panel 10 that displays an image and an FPC 20 having a circuit pattern formed thereon, which is electrically connected to the display panel 10 to transmit an electric signal to the display panel 10 for driving the display panel 10.

The display panel 10 includes a first substrate 11 on which a pixel array is formed and a second substrate 12 combined with the first substrate 11 while covering the pixel array. The first substrate 11 and the second substrate 12 may be formed of glass or a flexible material such as a polymer film or the like. In the first embodiment, the first and second substrates 11 and 12 are made of glass, the display panel 10 is a light emitting display panel having a pixel array composed of organic light emitting elements, and the display device 100 is for a large TV receiver. However, the present invention is not limited thereto. For example, the display panel may be a liquid crystal display panel.

The display panel 10 is in a rectangular shape having a pair of long sides and a pair of short sides. The FPC 20 is disposed at opposite long sides of the display panel 10 and electrically connected to signal lines (e.g. data lines and scan lines) to drive pixels of the pixel array. FIGS. 1 and 2 show only one long side of the display panel 10 for convenience, and detailed description of electrical connection of the FPC 20 to the display panel 10 is omitted because a conventional method is used for electrical connection of the FPC 20 and the display panel 10.

In one embodiment, the FPC 20 is fixed to the first substrate 11 in such a manner that the FPC 20 is formed on the first substrate 11 and bent toward the backside of the first substrate 11. That is, the FPC 20 is an integrated FPC. To implement the integrated FPC, a bonding pad 30 for fixing the FPC 20 is provided to the surface of the first substrate 11. An appropriate number of bonding pads 30 may be provided considering the size of the FPC 20. While four bonding pads 30 are provided for one FPC 20 in the embodiment of FIG. 1, the present invention is not limited thereto.

The FPC 20 has a shape disposed along the direction (y) of the long side of the display panel 10. That is, the FPC 20 is in a rectangular shape having a pair of long sides and a pair of short sides.

The FPC 20 includes a wiring pattern part 210 and a reinforcing part 212 attached to the surface of the wiring pattern part 210. The wiring pattern part 210 may be formed from an insulating film having a predetermined wiring pattern and the reinforcing part 212 is formed from a member capable of being combined with the wiring pattern part 210 to improve the strength of the wiring pattern part 210. However, the materials and shapes of the wiring pattern part 210 and the reinforcing part 212 are not limited thereto.

While the reinforcing part 212 is provided to only one side of the wiring pattern part 210 in the embodiment of FIG. 1, the reinforcing part 212 may be provided to both sides of the wiring pattern part 210. Furthermore, the reinforcing part 212 may partially cover one side of the wiring pattern part 210.

Specifically, the reinforcing part 212 is attached to the wiring pattern part 210 at predetermined intervals along the longitudinal direction (y) of the FPC 20.

Hereinafter, a portion of the wiring pattern part 210 to which the reinforcing part 212 is provided is referred to as a first region A1 and a portion of the wiring pattern part 210 to which the reinforcing part 212 is not provided is referred to as a second region A2 for convenience of description.

In the above-described structure, the FPC 20 has different flexibilities depending on portions. For example, flexibility of the second region A2 is greater than that of the first regions A1.

While the first and second regions of the FPC having differentiated flexibility according to presence or absence of the reinforcing part 212 provided to the wiring pattern part 210 are divided in the embodiment of FIG. 1, a method for achieving differentiated flexibility of the FPC is not limited to the structure of the FPC 20 of FIG. 1.

Differentiated flexibility of the FPC 20 prevents the FPC 20 from misalignment when the FPC 20 is fixed to the display panel 10 or from being fixed to the display panel 10 in a poor state due to a manufacturing tolerance of the FPC 20.

A process of fixing the FPC 20 to the display panel 10 is described with reference to FIGS. 3A to 3C.

Figure 3A:
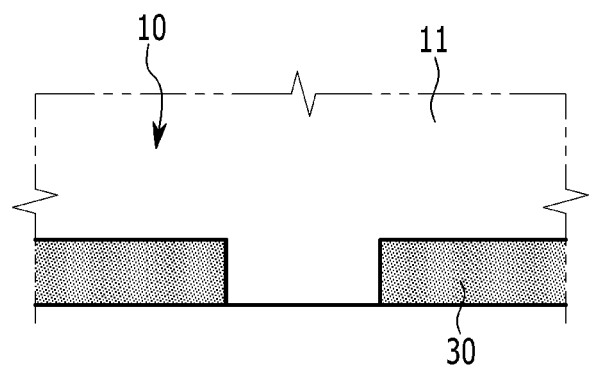
FIG. 3A to FIG. 3C are views for explaining a process of combining an FPC with a display panel according to the first embodiment.

As shown in FIG. 3A, the bonding pad 30 is provided to the surface of the first substrate 11 bonded to the second substrate 12. The bonding pad 30 may have a size corresponding to the first region A1 of the FPC 20. Furthermore, as many bonding pads 30 as the number of first regions A1 of the FPC 20 may be provided to the first substrate 11.

Since one FPC 20 includes four first regions A1 and three second regions A2 in the embodiment described, four bonding pads 30 can be provided to the first substrate 11 for one FPC 20. The number of first regions A1 or second regions A2 provided to one FPC can be adjusted as necessary.

Figure 3B:
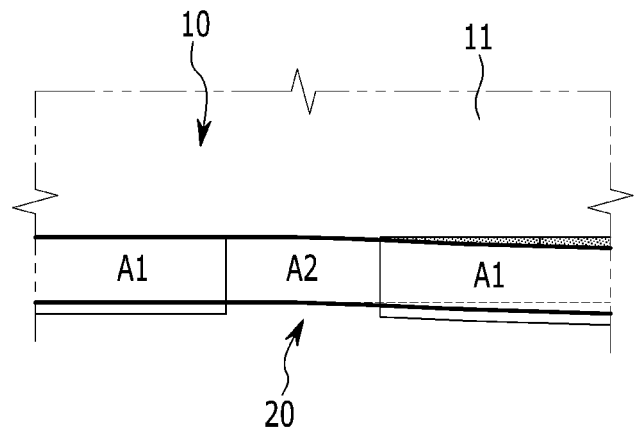

Referring to FIG. 3B, the FPC 20 is placed on the bonding pads 30 and fixed to the first substrate 11 according to adhesion of the bonding pads 30. The FPC 20 may be partially tilted when the FPC 20 is misaligned or has manufacturing tolerance, as described above, (refer to the right first region A1 shown in FIG. 3B).

When the FPC 20 is bonded to the bonding pads 30 in this state, the FPC 20 is poorly fixed to the display panel, decreasing productivity of the display device.

However, the FPC 20 according to embodiments herein can prevent the above-mentioned result. This can be achieved according to the second region A2 of the FPC 20. Specifically, even if the FPC 20 is provided to the surface of the display panel 10 in a misalignment state as shown in FIG. 3B, it is possible to dispose the FPC 20 on the display panel 10 in a correct alignment state by finely adjusting the misaligned first region A1 according to a bending degree of the second region A2 because the second region A2 has flexibility greater than that of the first region A1 and thus the second region A2 can be bent in the longitudinal direction (y) of the FPC 20.

In other words, even if the FPC is partially misaligned when the FPC is located on the display panel 10 to be fixed thereto, misalignment can be corrected by adjusting only a misaligned portion without aligning the whole area of the FPC.

Misalignment of the FPC 20 may be corrected using an alignment apparatus including a member capable of gripping and lifting the first regions A1.

Figure 3C:
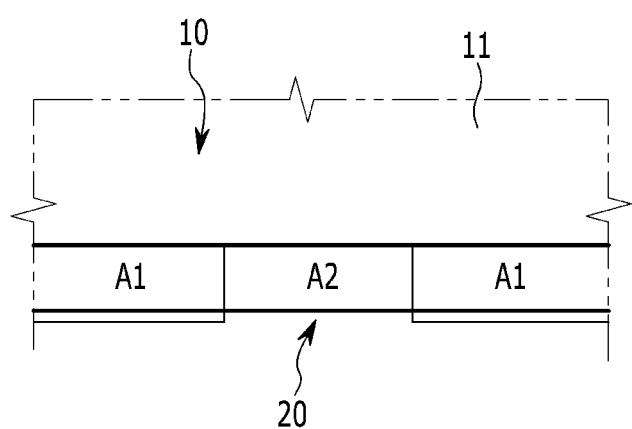

Upon completion of fine adjustment of the misaligned first region A1, the FPC 20 can be bonded to the bonding pads 30 and fixed to the surface of the display panel 10 as an integrated FPC (refer to FIG. 3C).

Figure 4:
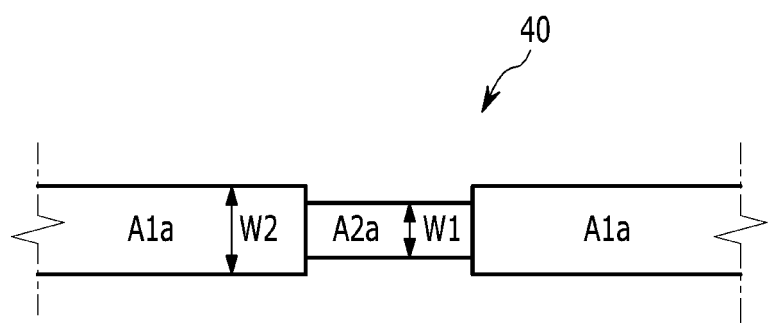
FIG. 4 is a partial top plan view of an FPC according to a second embodiment.
Figure 5:
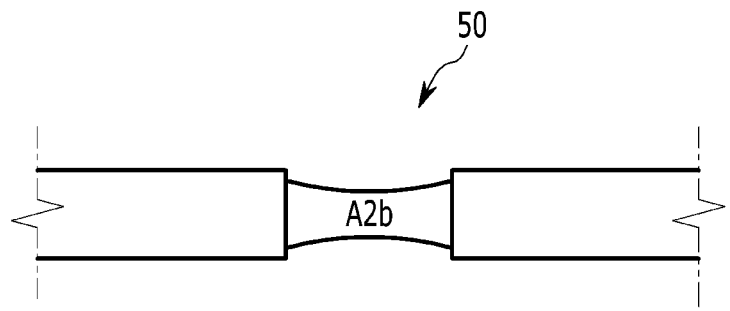
FIG. 5 is a partial top plan view of an FPC according to a third embodiment.

FIGS. 4 and 5 are partial top plan views of Faces according to second and third embodiments.

FIG. 4 is a partial top plan view of an FPC 40 according to the second embodiment. The FPC 40 has the same basic configuration as that of FPC 20 according to the first embodiment. The FPC 40 is formed in such a manner that a second region A2a has a width W1 narrower than the width W2 of a first region A1a. The widths W1 and W2 correspond to lengths in the direction (x) of the short sides of the FPC 40. Both edges of the second region A2a in the direction (y) of the long sides of the FPC 40 are straight.

FIG. 5 is a partial top plan view of an FPC according to the third embodiment. The FPC 50 has the same basic configuration as that of the FPC 40 according to the second embodiment. The FPC 50 is distinguished from the FPC 40 according to the second embodiment in that both edges of a second region A2b are curved. That is, the second region A2b can be formed in such a manner that both edges thereof are recessed to the center of the second region A2b, as shown in FIG. 5.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
    a display panel; and
    a flexible printed circuit (FPC) bonded to the display panel using a bonding pad disposed between the FPC and the display panel, wherein the FPC is formed in a rectangular shape having a pair of long sides and a pair of short sides;
    wherein the FPC includes at least one first region and at least one second region, the second region having a greater flexibility than the first region, wherein the at least one first region and the at least one second region are disposed adjacent to one another along a long side of the FPC,
    wherein the FPC includes a plurality of first regions, and the at least one second region is disposed between two regions among the plurality of first regions,
    wherein the FPC includes a wiring pattern part and a reinforcing part, the reinforcing part covering a portion of the wiring pattern part, and wherein the second region corresponds to a portion of the wiring pattern part not covered by the reinforcing part, and
    wherein the FPC is in a rectangular shape, and wherein a width of the second region in a direction of a short side of the FPC is smaller than a width of the first region in the direction of a short side of the FPC.

2. The display device of claim 1, wherein edges of the second region in a direction of a long side of the FPC are straight.

3. The display device of claim 1, wherein edges of the second region in a direction of the long side of the FPC are curved.

4. The display device of claim 3, wherein the edges of the second region are concave.

5. The display device of claim 1, wherein the display panel is formed in a rectangular shape having a pair of long sides and a pair of short sides, and wherein the FPC is disposed along the long sides of the display panel.

6. The display device of claim 1, wherein the display panel is formed in a rectangular shape having a pair of long sides and a pair of short sides, wherein the FPC is disposed along the long sides of the display panel, and wherein the second region is bendable around an axis parallel to the long sides of the FPC, toward the display panel.

7. The display device of claim 1, wherein the display panel is an organic light emitting display panel.

* * * * *